United States Patent [19]

Iguchi et al.

[11] Patent Number: 5,198,324

[45] Date of Patent: Mar. 30, 1993

[54] METHOD FOR MAKING LITHOGRAPHIC PRINTING PLATE

[75] Inventors: Shigeru Iguchi; Kiyoshi Futaki; Koichi Torizuka; Shozi Oka, all of Nagaokakyo, Japan

[73] Assignee: Mitsubishi Paper Mills Limited, Tokyo, Japan

[21] Appl. No.: 446,093

[22] Filed: Dec. 5, 1989

[30] Foreign Application Priority Data

Dec. 8, 1988 [JP] Japan ............................ 63-311321

[51] Int. Cl.$^5$ .......................................... G03C 1/43
[52] U.S. Cl. ................................. 430/265; 430/945; 430/302; 430/365
[58] Field of Search ............... 430/309, 945, 598, 264, 430/265, 302; 101/465, 466, 467

[56] References Cited

U.S. PATENT DOCUMENTS

| | | | |
|---|---|---|---|
| 3,099,209 | 7/1963 | Damtchrader et al. | 101/466 |
| 3,454,398 | 7/1969 | Wendt et al. | 101/466 |
| 3,761,276 | 9/1973 | Evans | 430/204 |
| 3,764,323 | 10/1973 | Strem et al. | 430/204 |
| 3,854,949 | 12/1974 | Gilman et al. | 430/598 |
| 3,867,150 | 2/1975 | Ketbey | 101/467 |
| 4,121,935 | 10/1978 | Nishina et al. | 430/302 |
| 4,168,167 | 9/1979 | Takenaka et al. | 430/264 |
| 4,212,672 | 7/1980 | Mihara et al. | 430/265 |
| 4,230,792 | 10/1980 | Tsubai et al. | 430/309 |
| 4,347,305 | 8/1982 | Shiba et al. | 430/302 |
| 4,501,811 | 2/1985 | Saikawa et. al. | 430/204 |
| 4,824,760 | 4/1987 | Yamamoto et al. | 430/302 |

OTHER PUBLICATIONS

RD 17712 (Jan. 1979) Borden et al. "Lithograph Sibby Materials".

Ynonroza, Rodge, Dec. 1985 "Lazers—Bright New Tool for the Graphic Arts", Graphics Monthly.

*Primary Examiner*—Richard L. Schilling
*Assistant Examiner*—M. Angebranndt
*Attorney, Agent, or Firm*—Cushman, Darby & Cushman

[57] ABSTRACT

The present invention provides a method for making a lithographic printing plate having high sensitivity and high printing endurance by scanner-exposing which comprises subjecting a photographic photosensitive material comprising a support and, provided thereon, an unfogged internal latent image type silver halide emulsion layer to scanner-exposing, subjecting the exposed photosensitive material to non-tanning development in the presence of a nucleating agent, and then subjecting the silver halide portion of the emulsion layer to an oleophilizing treatment.

7 Claims, No Drawings

METHOD FOR MAKING LITHOGRAPHIC PRINTING PLATE

BACKGROUND OF THE INVENTION

The present invention relates to a method for making a lithographic printing plate and in particular to a method for making a silver salt lithographic printing plate of high sensitivity and high printing endurance by scanner-exposure.

It has been known for a long time to make a lithographic printing plate directly from originals utilizing the high sensitivity of silver halide emulsion and the most popular now is utilization of silver complex diffusion transfer process. (For example, Japanese Patent Kokoku No. 48-30562 and Japanese Patent Kokai Nos. 53-21602, 54-103104 and 56-9750). Recently, there have been developed and begun to be practically used lithographic printing plates which are made utilizing silver complex diffusion transfer process by scanner-exposing using helium-neon laser, argon laser, light emitting diode (LED), semiconductor laser, etc. (For example, Japanese Patent Kokai Nos. 59-71055, 59-71056, 60-29751, 60-19141, 60-100147, 62-103649, and 62-105147-105150).

However, although these lithographic printing plates made by scanner-exposing process have far higher sensitivity than those made by camera-exposing process, they are still not sufficient in the sensitivity and have the defects of low printing endurance, especially, of very fine line images.

SUMMARY OF THE INVENTION

The object of the present invention is to provide a method for making lithographic printing plates having high sensitivity and printing endurance by employing scanner-exposing process.

The above object has been attained by a method characterized by subjecting a photosensitive material comprising a support and, provided thereon, an unfogged internal latent image type silver halide emulsion layer to scanner-exposing, subjecting the exposed photosensitive material to non-tanning developing in the presence of a nucleating agent and then subjecting silver halide portion of the emulsion layer to an oleophilizing treatment.

The internal latent image type silver halide emulsion the surface of which is not fogged is an emulsion in which sensitivity of the inner part of silver halide grains is higher than the sensitivity of the surface of the grains and clearly distinguished from the usual surface latent image type emulsion in which latent image is formed on the surface of the grains. (U.S. Pat. Nos. 2,592,250, 1,011,062, 2,996,382, 3,178,282, 3,206,313, 3,271,157, 3,317,322, 3,447,927, 3,511,662, 3,737,313, and 3,761,276, British Patent No. 1027146, and Japanese Patent Kokoku No. 43-29405). Definition of the emulsion of this type is as follows.

That is, the emulsion is such that maximum density obtained when development is carried out with a developer (internal type developer) containing a solvent capable of sufficiently dissolving silver halide grains such as sodium thiosulfate in a large amount must be much higher than maximum density attained when development is carried out with the usual surface developer. Specifically, when said internal latent image type emulsion is coated on a support and dried and exposed for a fixed time of 0.01–1 second and then developed in the following developer A (internal type developer) at 20° C. for 3 minutes, the maximum density measured by ordinary method of measurement of photographic density is at least 5 times the maximum density obtained when said silver halide emulsion exposed in the same manner as above is developed in the following developer B (surface type developer) at 20° C. for 4 minutes. Preferably, the maximum density obtained with developer A is more than 10 times that obtained with developer B.

| Developer A (internal type developer): | |
|---|---|
| Hydroquinone | 15 g |
| Monomethyl-p-aminophenol sesquisulfate | 15 g |
| Sodium sulfite | 50 g |
| sodium hydroxide | 10 g |
| sodium thiosulfate | 25 g |
| Water to make up 1 liter. | |
| Developer B (surface type developer): | |
| p-Hydroxyphenylglycine | 10 g |
| Sodium carbonate | 100 g |
| Water to make up 1 liter. | |

As mentioned in the above patent specifications, such internal latent image type silver halide emulsion the surface of which is not fogged can be prepared, for example, by a method which comprises covering internal nuclei of silver halide chemically sensitized or doped with metals such as iridium and rhodium with silver halide which is subjected to substantially no chemical sensitization or a method which comprises mixing coarse grain emulsion chemically sensitized or doped with metal with fine grain emulsion to deposit the fine grain emulsion on the coarse grain emulsion.

The internal latent image type silver halide emulsion used in the present invention may contain usual additives such as optical sensitizer, chemical sensitizer (in such an amount not to increase sensitivity over internal sensitivity in case of applying it to the surface of silver halide grains), antifoggant, stabilizer, hardener, coating aid, plasticizer, development accelerator, air fogging preventing agent, and matting agent. The optical sensitizers include, for example, polymethylene dyes such as cyanin dyes, merocyanin dyes, rhodacyanin dyes, hemicyanin dyes and styryl dyes. These may be used in combination of two or more for supersensitization or in combination with colorless aromatic compound.

Specifically, these sensitizers can be selected from known sensitizing dyes disclosed in the above-mentioned patent specifications relating to scanner-exposing lithographic printing plates so as to conform to wavelength of light source for scanner-exposing.

Amount of the sensitizing dyes added can be optionally changed in the range of about $1 \times 10^{-6}$ mol to about $1 \times 10^{-3}$ mol per 1 mol of silver halide. The sensitizing dyes and other additives can be added by the methods known to the art.

Binders used for internal latent image type silver halide emulsion of the lithographic printing plate according to the present invention are normally gelatin and this gelatin may be partly replaced with one or more of hydrophilic polymer binders such as starch, albumin, sodium alginate, hydroxyethyl cellulose, gum arabic, polyvinyl alcohol, polyvinylpyrrolidone, carboxymethyl cellulose, polyacrylamide, styrene-maleic anhydride copolymer, and polyvinylmethyl ether-maleic anhydride copolymer. Furthermore, vinyl polymer aqueous dispersion (latex) may also be used.

Supports include, for example, paper, films such as cellulose acetate film, polyvinyl acetal film, polystyrene film, polypropylene film, polyethylene terephthalate film, films such as polyester, polypropylene and polystyrene films laminated with a polyethylene film, a metal, metallized paper and metal/paper laminate. Paper supports coated with an α-olefin polymer such as polyethylene on one or both sides are also effective. These supports may contain compounds having ability to prevent halation.

An undercoat layer which also serves as an antihalation layer may be provided between emulsion layer and support and this undercoat layer may contain a matting agent or the like.

The nucleating agent used in the present invention is preferably contained in a photosensitive material used for making lithographic printing plate or/and developing solution. The nucleating agent used is one which preferentially forms surface development nuclei for silver halide having no internal latent image (namely, internal development nuclei) during development, thereby to make silver halide grains to be developable with surface type developer and on the other hand has substantially no action of forming surface development nuclei for silver halide grains in which internal latent image (internal development nuclei) has been formed by scanner-exposure. The nucleating agent may be a precursor thereof and various compounds have been known as disclosed, for example, in U.S. Pat. Nos. 2,588,982, 3,227,552, 3,615,615, 3,719,494, and 3,734,738. As examples thereof, mention may be made of 2-methyl-3-[3-sulfophenylhydrazone)propyl]benzothiazolium bromide, 2-methyl-3-(β-hydroxyethyl)benzothiazolium bromide, p-methanesulfonamido-ethylphenylhydrazine, 1,2-dihydro-3-methyl-4-phenyl-pyrido[2,1-b]benzothiazolium bromide, 3-(2-acetylethyl)-2-benzylbenzoselenazolium bromide, 1-[3-N-(4-formylhydrozino-phenyl)carbamoylphenyl]-2-phenylthiourea, 1-[4-(2-formylhydrazino)phenyl]-2-phenylthiourea, phenylhydrazine, m-tolylhydrazine, p-tolylhydrazine, hydrazobenzene, p-nitrophenylhydrazine, hydrazine, $KBH_4$, and $SnCl_2$.

Amount of the nucleating agent is preferably 50–1500 mg/1 mol Ag when contained in photosensitive material and 0.05–5 g/liter when contained in developer.

Lithographic printing plates having internal latent image type silver halide emulsion are disclosed, for example, in Japanese Patent Kokai No. 53-19205 (tanning development) and Japanese Patent Kokai No. 56-60442 (laminate photosensitive material type), but in case of these lithographic printing plates, layer of exposed portion is removed and unexposed portion is made ink-receptive and since a strong second exposure is applied, edge portion of image or fine line image are inferior in printing endurance and furthermore time and trouble are required for plate making. Besides, there is the problem in maintenance of processing solution.

The plate making method of the present invention has solved the many problems in the above-mentioned lithographic printing plates including lithographic printing plates according to silver complex diffusion transfer process when these are made by scanner-exposing.

According to the plate making method of the present invention, lithographic printing plate is made by subjecting a photosensitive material to scanner-exposing by the above-mentioned various laser beams and the like; developing which is not tanning development; if necessary, a treatment with an acidic stop solution; and then a treatment for making undeveloped silver halide of exposed portion oleophilic and ink-receptive.

Making silver halide oleophilic can be performed, for example, by known methods such as treatment with thiol compounds as disclosed in U.S. Pat. No. 3,099,209, terminal ethynyl compounds as disclosed in 3,454,398, benzotriazole as disclosed in U.S. Pat. No. 3,764,323, silver halide solvent and mercapto compound as disclosed in Japanese Patent Kokai No. 53-9603, and dimercapto compound as disclosed in Japanese Patent Kokai No. 58-127928.

EXAMPLE 1

3-(2-Acetylethyl)-2-benzylbenzoselenazolium bromide (nucleating agent, 150 mg/1 mol Ag), a hardener and a surface active agent were added to a red sensitive internal latent image type silver halide emulsion (silver iodobromide emulsion containing 2 mol % of silver iodide, 1.3 $g/m^2$ in terms of Ag) prepared by the process mentioned in U.S. Pat. No. 3,761,276. The mixture was coated on a gelatin undercoat layer (gelatin 2.5 $g/m^2$) containing carbon black provided on a polyester film support.

The resulting photographic material was subjected to scanner-exposure with helium-neon laser beam, then developed with the following developer at 30° C. for 20 seconds and neutralized with an acidic stop solution.

| Composition of developer | |
|---|---|
| Water | 700 ml |
| Hydroquinone | 10 g |
| Sodium sulfite | 40 g |
| 1-Phenyl-3-pyrazolidone | 1 g |
| Sodium hydroxide | 15 g |
| 5-Methyl-benzotriazole | 0.05 g |
| Water to make up 1 liter. | |

Subsequently, the material was immersed in an oleophilizing solution having the following composition at 25° C. for 30 seconds, squeezed and dried to obtain a negative type printing plate.

| Composition of oleophilizing solution | |
|---|---|
| Water | 600 ml |
| Sodium thiosulfate | 15 g |
| Sodium sulfite | 10 g |
| Monobasic ammonium phosphate | 25 g |
| 2-Mercapto-5-propyl-1,3,5-oxadiazole | 1 g |
| Isopropyl alcohol | 200 ml |
| Water to make up 1 liter. | |

This printing plate was mounted on an offset printing machine and printing was carried out using dampening solution SLM-OD for Silver Master manufactured by Mitsubishi Paper Mills Ltd. Even a fine line of 30 μ in width did not fall off after printing of 5000 or more copies.

COMPARATIVE EXAMPLE 1

The photographic material of Example 1 after subjected to scanner-exposure was developed with the following developer at 20° C. for 120 seconds, then washed out with water of 50° C. and dried to obtain a positive printing plate.

| Composition of developer | |
| --- | --- |
| Pyrogallol | 3 g |
| Metol | 1 g |
| Sodium carbonate | 112.5 g |
| Potassium bromide | 1.5 g |
| Citric acid | 1 g |
| Sodium polymetaphosphate | 1 g |
| Water to make up 1 liter. | |

Using this printing plate, printing was carried out in the same manner as in Example 1. Fine lines of 30 μ fell off after printing of 2000 copies.

COMPARATIVE EXAMPLE 2

Printing plate (F) mentioned in Example 2 of Japanese Patent Kokai No. 53-21601 was made in the manner mentioned therein and this was subjected to scanner-exposure in the same manner as in Example 1 and was subjected to silver complex diffusion transfer development. However, formation of image was difficult owing to low sensitivity.

The printing plate was made by exposure using camera and the resulting printing plate withstood printing of only 2000 copies.

COMPARATIVE EXAMPLE 3

A commercially available printing plate for helium-neon laser beam exposure (positive type lithographic printing plate of Mitsubishi Paper Mills Ltd. which utilizes silver complex diffusion transfer process) was subjected to scanner-exposure and then to silver complex diffusion transfer development, followed by printing using an etch solution (SLM-OH) and a dampening solution (SLM-OD). Fine lines of 30 μ fell off after printing of 3000 copies.

EXAMPLE 2

Example 1 was repeated except that a near infrared sensitive internal latent image type silver halide emulsion having a sensitivity maximum at about 780 nm was used and an output device for semiconductor laser of 780 nm was used. The similar results to those of Example 1 were obtained.

As explained above, the present invention can provide a lithographic printing plate of higher sensitivity and higher printing endurance as compared with conventional methods which make printing plate directly by scanner-exposure according to silver salt method.

What is claimed is:

1. A method for making a lithographic printing plate which comprises subjecting a photographic photosensitive material comprising a support and, provided thereon, an unfogged internal latent image type silver halide emulsion layer to scanner-exposing, subjecting the exposed photosensitive material to non-tanning development in the presence of a nucleating agent, and then subjecting the silver halide portion of the emulsion layer to an oleophilizing treatment.

2. A method according to claim 1, wherein the scanner-exposure is carried out by helium-neon laser, argon laser, light emitting diode or semiconductor laser.

3. A method according to claim 1, wherein the emulsion layer contains at least one sensitizing dye.

4. A method according to claim 1, wherein an undercoat layer is provided between the support and the emulsion layer.

5. A method according to claim 1, wherein the nucleating agent is contained in the photosensitive material, a developer used for the non-tanning development or both of them.

6. A method according to claim 1, wherein the nucleating agent is a precursor for the nucleating agent.

7. A method according to claim 1, wherein the oleophilizing treatment comprises subjecting the silver halide portion of the emulsion layer to a solution containing a silver halide solvent and a mercapto compound.

* * * * *